United States Patent [19]
Gandini et al.

[11] Patent Number: 5,309,449
[45] Date of Patent: May 3, 1994

[54] ELECTRONIC CIRCUIT FOR GENERATING ERROR DETECTION CODES FOR DIGITAL SIGNALS

[75] Inventors: Marco Gandini, Turin; Giovanni Ghigo, Luserna S. Giovanni; Mauro Marchisio, Turin, all of Italy

[73] Assignee: Sip-Societa Italiana Per L'Esercizio Delle Telecomunicazioni P.A., Turin, Italy

[21] Appl. No.: 658,219

[22] Filed: Feb. 20, 1991

[30] Foreign Application Priority Data

Mar. 1, 1990 [IT] Italy .................. 67146 A/90

[51] Int. Cl.$^5$ ............... G06F 11/10; H03M 13/00
[52] U.S. Cl. .................................... 371/37.1
[58] Field of Search .......... 371/37.1, 37.7, 37.5, 371/37.6

[56] References Cited

U.S. PATENT DOCUMENTS

| | | |
|---|---|---|
| 3,811,108 | 5/1974 | Howell .................. 371/37.1 |
| 4,502,141 | 2/1985 | Kuki .................... 371/37.1 |
| 4,559,568 | 12/1985 | Watanabe et al. . |
| 4,606,026 | 8/1986 | Baggen ................. 371/37.1 |
| 4,723,244 | 2/1988 | Iacoponi . |
| 4,910,736 | 3/1990 | Tanaka et al. ......... 371/37.7 |
| 4,937,828 | 6/1990 | Shih et al. ............ 371/37.1 |

FOREIGN PATENT DOCUMENTS

0255761A2 6/1987 European Pat. Off. .
89/10029 10/1989 PCT Int'l Appl. .

Primary Examiner—Robert W. Beausoliel, Jr.
Assistant Examiner—Albert Decady
Attorney, Agent, or Firm—Herbert Dubno

[57] ABSTRACT

An electronic circuit for generating error detection codes in digital signals organized into serial data blocks, which derives the error code from the coefficients of a remainder polynomial obtained from the division of a dividend polynomial, whose coefficients are the bits of each serial block, and a convenient divisor polynomial. The circuit has a shift register wherein at the beginning of each serial data block the reset and the first datum load are performed in a single clock interval.

3 Claims, 1 Drawing Sheet

ELECTRONIC CIRCUIT FOR GENERATING ERROR DETECTION CODES FOR DIGITAL SIGNALS

FIELD OF THE INVENTION

The present invention relates to the systems for data signal transmission and to er functioning of the apparatus and capable of processing the signals. More particularly the invention relates to an electric circuit for generating error.

BACKGROUND OF THE INVENTION

When transmission system quality is to be evaluated, it is usual to associate with a certain block of digital signals to be transmitted a digital code obtained by duly processing the signals themselves, and to check whether this code is equal to the code obtained from the block of the received digital signals, processed in the same way as at the transmission. When, however, the correct functioning of an apparatus or a circuit is to be evaluated, a circuit is added for extracting some digital signals from suitable points of the item to be tested and a digital code is computed which is compared with a known code. The comparison results allows the proper functioning or malfunctioning of the item under test to be checked.

A particular kind of such codes, referred to as cyclic redundancy codes or CRD, is obtained as follows. Each block of N digital signals, each of them being associated with a code, is considered as a polynomial of degree N, whose coefficients are the bits of the block itself. This polynomial is divided by a divisor polynomial, having a suitable degree and suitable coefficient values, and the division remainder polynomial coefficients, of degree lower by a unit than that of the divisor, form the cyclic redundancy code of CRC. The higher the remainder polynomial degree, the more accurate the check performed on the data to be tested. Of course, even the complexity of the circuits which perform the division between the polynomials is higher.

The polynomial division, effected by modulus-2 subtractions or additions, i.e. without carry or borrow, generally requires rather complex electronic circuits. However, by exploiting the fact that the data are generally organized into serial blocks and the divisor polynomial is constant and predetermined, the division circuit can be considerably simplified.

A few examples of division circuits, used for generating cyclic codes for error detection, are described in the paper entitled "Cyclic Codes for Error Detection", by W. W. Peterson and D. T. Brown, issued on Proceedings on the IRE, January 1961. They basically consist of a shift register, with a number of stages lower by a unity than the degree of the divisor polynomial, and of modulus-2 adders placed in between the register stages, corresponding to the divisor polynomial terms with coefficients different from zero. Each adder adds the bit coming from the preceding stage of the shift register to the bit entering the division circuit at that instant. The adders are implemented by exclusive-OR gates. As is easy to understand, the division operation is performed by successive shift operations, corresponding to the multiplication of the divisor by the single terms of the quotient, and by modulus-2 additions, corresponding to the successive subtractions of the products obtained from the updated dividend.

Another example of division circuitry wherein the divisor polynomial can be chosen time by time, is described in the paper entitled "Self-Testing by polynomila division" by D. K. Bhavsar and R. W. Heckelman, presented at the International Test Conference, Philadelphia, October 1981. IN this circuit, used for checking the functioning of complex circuits, there are adders at each shift register stage and the signal outgoing from the division circuit is brought to each adder only if the relevant coefficient of the divisor polynomial is different from zero. This higher flexibility of course entails higher circuit complexity.

Moreover, both the solutions examined require a previous operation of reset of the shift register contents whenever the cyclic redundancy code is calculated for a data block, operating in the time interval comprised between the last datum of a block and the first datum of the subsequent block. This operation, in case it is to be performed on the serial flow of data with the relevant clock signals, requires the generation of a reset signal with active phase placed between two successive blanks of the clock signal. It is clear that the generation of such a signal requires rather complex circuits and can cause malfunctionings, especially if the active phase above is not synchronous with the clock signal.

OBJECT OF THE INVENTION

It is the object of the invention to overcome these disadvantages with an improved electronic circuit for generating error detection codes for digital signals, which is simply feasible, allows reset operation to be performed at the same time as the load of the first bit of each data block, using a reset signal extracted from the present clock signals, and is easy to integrate.

SUMMARY OF THE INVENTION

The present invention provides an electronic system for generating error detection code in digital signals, organized in data blocks forming the coefficients of a dividend polynomial, to be divided by a suitable divisor polynomial of degree n to obtain a remainder polynomial of n-1 degree, whose coefficients form the error detection code, the circuit consisting of a shift register composed on n-1 flip-flops, wherein the signal outgoing from the (i-1)th flip-flop, i being comprised between O and n, is sent to a first input an (i)th flip-flop directly or through an adder, according to whether the coefficient of the term of (i)th degree of the divisor polynomial is equal to or different from zero, said adder adding to the signal outgoing from the preceding flip-flop a feedback signal obtained at he output of the (n)th flip-flop, either directly or after adding it to the input data signal, all the flip-flops being clocked by a common clock signal. According to the invention a second input of the (i)th flip-flop accepts the first bit of said data block or a bit at low logic value, according to whether the coefficient of term of degree (i)th of the divisor polynomial is respectively different from or equal to zero, in correspondence with the clock signal transition relevant to the first bit of the data block, while at the subsequent transitions the (i)th flip-flop accepts the signals present at the first input, the first or second inputs being enabled according to the logic level of a signal active in correspondence with the first bit of a data block.

BRIEF DESCRIPTION OF THE DRAWING

The above and other objects, features and advantages of the invention will become more readily apparent from the following description, reference being made to the accompanying highly diagrammatic drawing in which.

SPECIFIC DESCRIPTION

Figure 1:
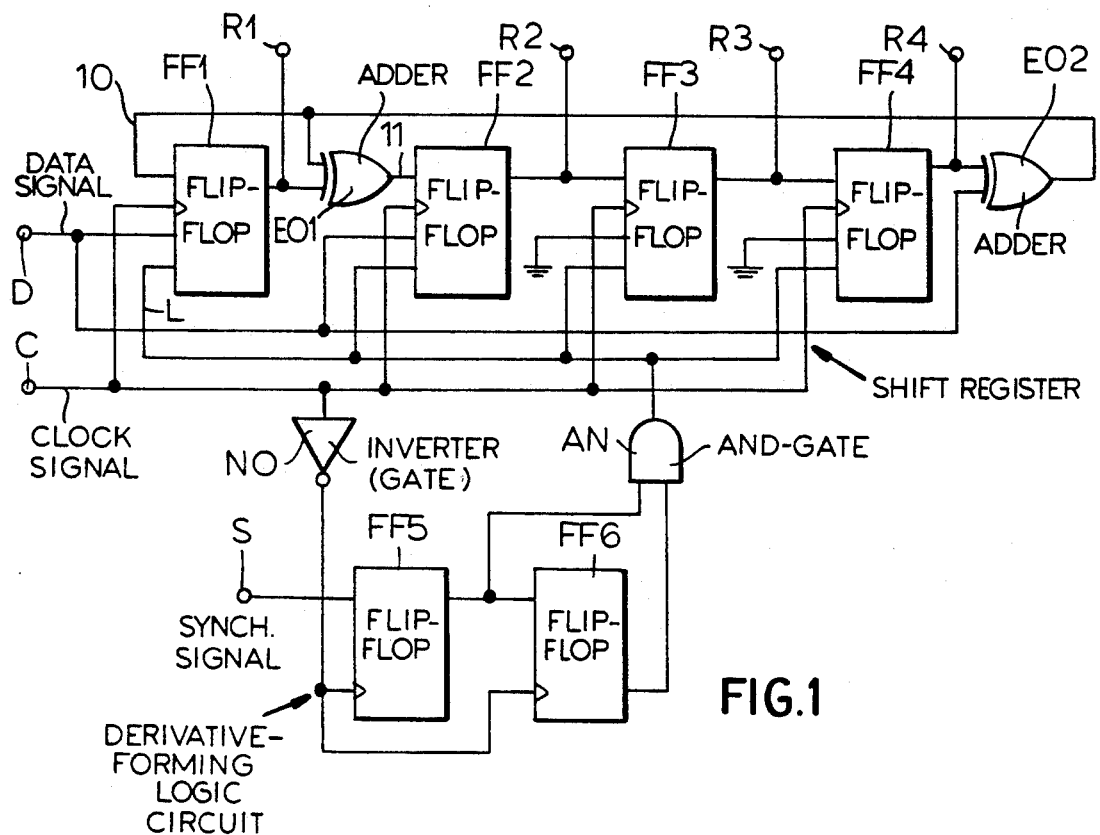
FIG. 1 is a block diagram of the electronic circuit for generating error detection codes for digital signals.

The circuit shown in FIG. 1 generates a cyclic renundancy code obtained from the division of data blocks, present at the input on wire D, by a convenient divisor polynomial of $x^4+x+1$ type. The division remainder, coincident with the desired code, is made available at the output on wires R1, R2, R3 and R4, with the least significant bit on wire R1.

The circuit consists of a shift register, implemented with 4 flip-flops FF1, FF2, FF3, FF4, whose number is equal to the degree of the desired B remainder polynomial, and by two modulus-2 adders EO1 and EO2, implemented by exclusive-OR gates. The adder EO1 is placed between the first and the second stage of the shift register, while adder EO2 is placed at the output, so as to implement respectively the feedback relevant to the term of the first degree x of the divisor polynomial and the feedback relevant to the term of the fourth degree $x^4$. More particularly, EO2 adds the signal outgoing from flip-flop FF4, on wire R4, and the data signal present on input wire D, supplying at the output on wire 10 the feedback signal, while EO1 adds the signal outgoing from flip-flop FF1 and the feedback signal supplied by EO2, supplying at the output on wire 11 the signal for a first input of flip-flop FF2. The feedback signal on wire 10 is also brought to a first FF1 input, so as to implement the reaction relevant to the constant term of the divisor polynomial. Finally the signal at the flip-flop FF2 output is directly brought to a first flip-flop FF3 input connected to wire R2 and the signal at FF3 output is directly brought to a first flip-flop FF4 input connected to wire R3.

The data signal present on wire D is also brought to a second input of flip-flop FF1 and to a second input of flip-flop FF2, while a second input of flip-flop FF3 and a second input of FF4 are set at low logic level, in function of the values of the coefficients of the divisor polynomial.

All the clock inputs of the four flip-flops are connected to wire C, upon which a clock signal associated with the input data arrives. The leading flank of the clock signal causes the signals at the inputs of flip-flops FF1, . . . , FF4 to be loaded. More particularly, according to the logic level of the signal present on wire L, connected to all the flip-flops FF1, . . . , FF4, either the signals present at the first inputs or those present at the second inputs are accepted.

The signal present on wire L is generated by a logic circuit forming the derivative out the derivative, which consists of two flip-flops FF5, FF6 and of two gates NO and AN, starting from a synchronism signal indicating the beginning of each block of data, present on wire S.

Gate NO inverts the clock signals present on wire C and sends it to the clock inputs of flip-flops FF5 and FF6. Flip-flop FF5 receives at the data input the synchronism signal present on wire S and supplies the flip-flop FF6 data input with the signal present at its true output. The AND gate AN receives both the signal at the true output of FF5 and the signal at the complementary output of FF6, and supplies at the output on wire L the signal which will be used by the flip-flops FF1, FF2 to load the input datum on wire D and by flip-flops FF3, FF4 to load the low logic level at the beginning of each data block.

Figure 2:
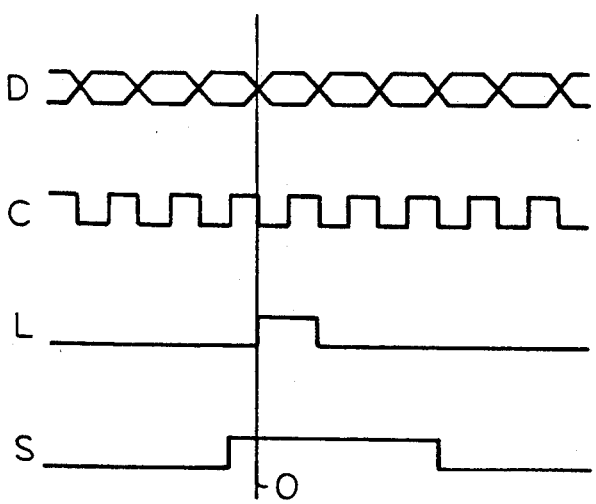
FIG. 2 is a representation of a few waveforms present at the main circuit points.

Let us see now the circuit operation with the help of the timing diagram of FIG. 2, wherein there are the waveforms of a number of signals present at the main circuit points. They are denoted by the same reference characters as those denoting in the preceding Figure the corresponding wires.

As previously stated, flip-flops FF1, . . . , FF4 are activated by the leading flanks of the clock signal C, which arrive in the time slots in which data D are stable, while in correspondence with the trailing edges of clock signal C data D can change. The same trailing edges, thanks to the presence of the inverting gate NO, activate flip-flops FF5, FF6 of the circuit generating signal L.

Generally synchronism signal S is at low logic level, that is why the signal at the FF5 true output is at low logic level and the signal at FF6 complementary output is at high level, hence signal L, supplied by gate AN, is at low level. When the synchronism signal S passes to high level, indicating the beginning of a data group, at the first trailing edge of the clock signal C also the signal at the true output of FF5 passes to high level, that is why at the inputs of gate AN there are two high level signals, which raise signal L to high level. At the subsequent trailing edge of clock signal C, the signal at the complementary output of FF6 passes to low level, returning then signal L to low level. This signal will undergo no variation when synchronism signal S returns to low level.

As can be seen 2, signal L is at high level in correspondence with the leading edge of clock signal C relevant to the first bit of the data block, starting in correspondence with the vertical line denoted by O. Under these conditions clock signal C causes the datum on wire D to be transferred to the outputs of flip-flops FF1, FF2 and the low logic level to be transferred to the outputs of flip-flips FF3, FF4. In this way the register composed of four flip-flops FF1, . . . , FF4 remains in the same condition in which it would have been found after a previous operation of reset and a subsequent operation of load of the first datum. According to the present invention these two operations are performed at the same time by exploiting a unique clock period.

From the subsequent clock pulse on, to the end of the data block, signal L causes flip-flops FF1, . . . , FF4 to accept the signals present respectively on wires 10, 11, R2, R3, while the subsequent data on wire D, whereupon the division in serially carried out, are introduced through the adder EO2. IN this way the circuit behaves as a conventional polynomial divider.

The fact of inserting the incoming data at the end of the shift register, through EO2, entails their multiplication by the degree of the divisor polynomial, in this case $x^4$. That allows a faster computation, since it is not necessary to wait for four clock intervals to from on wires R1, R2, R3, R4 the polynomial remainder. However, the circuit operation would no change if adder EO2 were directly placed at FF1 input.

It is clear that what described has bee given only by way on non-limiting example. Variations and modifications are possible without going out of the scope of the claims.

I claim:

1. An electronic system for generating error detection code in digital signals, organized in data block (D) forming the coefficients of a dividend polynomial, to be divided by a suitable divisor polynomial of degree n to obtain a remainder polynomial of n-1 degree, whose coefficients form the error detection code, the circuit consisting of a shift register composed of n-1 flip-flops (FF1, ..., FF4), including:
   a first flip-flop (FF1) receiving a data signal (D) from a data input, a logic signal (L) common to all of the flip-flops of said shift register, a clock signal (C) common to all of the flip-flops of the shift register, and a feed-back signal (10);
   a second flip-flop (FF2) receiving an adder signal (11), said data signal (D), said clock signal (C) and said logic signal (L);
   at least one further flip-flop (FF3) receiving an input from an output of a preceding flip-flop of the shift register, said clock signal (C) and said logic signal (L) and having an output connected to an input of a subsequent flip-flop of the shift register;
   a final flip-flop (FF4) having an input from a preceding flip-flop of the shift register, said clock signal 1(C) and said logic signal (L);
   an adder (EO1) receiving an output from said final flip-flop and said data signal (D) and generating said feed-back signal (10); and
   another adder (EO2) receiving an output from said first flip-flop (FF1$_{13}$ and from said feed-back signal (10) and generating said adder signal (11), wherein the signal outgoing from the (i-1)th flip-flop, i being a number between O and n, is sent to a first input of an (i)th flip-flop directly or through said adder (EO1), according to whether the coefficient of the term of (i)th degree of the divisor polynomial is equal to or different from zero, said adder (EO1) adding to the signal outgoing from the preceding flip-flop said feedback signal (10) obtained at the output of the (n)th flip-flop, either directly or after adding it at adder (EO2) to the input data signal (D), means for clocking said flip-flops with said common clock signal (C), a second input of the (i)th flip-flop accepting the first bit of said data block or a bit at low logic value, according to whether the coefficient of term of degree (i)th of the divisor polynomial is respectively different from or equal to zero, in correspondence with a clock signal (C) transition relevant to the first bit of the data block, at subsequent transitions the (i)th flip-flop accepting the signals present at the first input, the first or second inputs of the (i)th flip-flop being enabled according to the logic level of said logic signal (L) active in correspondence with the first bit of a data block, said logic signal (L) active in correspondence with the first bit of a data block being generated by a logic circuit (FF5, FF6, AN) generating a derivative and including an inverter receiving said clock signal (C), and receiving a synchronism signal (S) signalling start of a data block, resetting said shift register and reading data from said data block into the shift register.

2. An electronic system for generating error detection code in digital signals, organized in data blocks (D) forming the coefficients of a dividend polynomial, to be divided by a suitable divisor polynomial of degree n to obtain a remainder polynomial of n-1 degree, whose coefficients form the error detection code, the circuit consisting of a shift register composed of n-1 flip-flops (FF1, ..., FF4), wherein the signal outgoing from the (i-1)th flip-flop, i being a number between O and n, is sent to a first input of an (i)th flip-flop directly or through an adder (EO1), according to whether the coefficient of the term of (i)th degree of the divisor polynomial is equal to or different from zero, said adder adding to the signal outgoing from the preceding flip-flop a feedback signal (10) obtained at the output of the (n)th flip-flop, either directly or after adding it (EO2) to the input data signal (D), means for clocking said flip-flops with a common clock signal (C), a second input of the (i)th flip-flop accepting the first bit of said data block or a bit at low logic value, according to whether the coefficient of term of degree (i)th of the divisor polynomial is respectively different from or equal to zero, in correspondence with a clock signal (C) transition relevant to the first bit of the data block, at subsequent transitions the (i)th flip-flop accepting the signals present at the first input, the first or second inputs of the (i)th flip-flop being enabled according to the logic level of a signal (L) active in correspondence with the first bit of a data block.

3. An electronic circuit as in claim 2 wherein said signal (L) active in correspondence with the first bit of a data block is generated by a logic circuit (FF5, FF6, AN) generating a derivative and including an inverter receiving said clock signal (C), and receiving a synchronism signal (S) signalling start of a data block, resetting said shift register and reading data from said data block into the shift register.

* * * * *